US008924601B2

(12) United States Patent
Vogan et al.

(10) Patent No.: US 8,924,601 B2
(45) Date of Patent: Dec. 30, 2014

(54) APPARATUS AND METHOD FOR DEFECT REVECTORING IN A MULTI-CHANNEL MASS STORAGE DEVICE

(75) Inventors: Andrew Wayne Vogan, Aloha, OR (US); Jeffrey McVay, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 259 days.

(21) Appl. No.: 12/384,499

(22) Filed: Apr. 6, 2009

(65) Prior Publication Data

US 2010/0257323 A1  Oct. 7, 2010

(51) Int. Cl.
*G06F 3/00* (2006.01)
*G11C 29/04* (2006.01)

(52) U.S. Cl.
CPC ........ *G11C 29/04* (2013.01); *G11C 2029/0409* (2013.01)
USPC .................................. 710/15; 710/17; 710/18

(58) Field of Classification Search
USPC ............................................................ 710/15
See application file for complete search history.

(56) References Cited

U.S. PATENT DOCUMENTS

| 5,469,390 | A  | * | 11/1995 | Sasaki et al. ................ 365/200 |
| 6,188,618 | B1 | * | 2/2001  | Takase ........................ 365/200 |
| 2005/0204187 | A1 | * | 9/2005 | Lee et al. ........................ 714/8 |
| 2007/0143536 | A1 |   | 6/2007 | Sidhu et al. |
| 2008/0320214 | A1 | * | 12/2008 | Ma et al. ....................... 711/103 |
| 2009/0044078 | A1 |   | 2/2009 | Vogan et al. |
| 2009/0089508 | A1 |   | 4/2009 | Trika et al. |
| 2010/0085825 | A1 | * | 4/2010 | Keeth et al. ................... 365/200 |
| 2010/0169743 | A1 |   | 7/2010 | Vogan et al. |

* cited by examiner

*Primary Examiner* — Henry Tsai
*Assistant Examiner* — Dean Phan
(74) *Attorney, Agent, or Firm* — Jordan IP Law, LLC

(57) ABSTRACT

In some embodiments, a mass storage system may include a mass storage device having a plurality of memory channels, and a controller coupled to the mass storage device, wherein the controller is configured to control access to the mass storage device. For example, the controller may include code to determine a first vertical redirect budget for a first memory channel of the plurality of memory channels, revector defects in the first memory channel vertically within the first memory channel until the first vertical redirect budget is exceeded, and revector defects in the first memory channel horizontally outside of the first memory channel within another memory channel of the plurality of memory channels after the first vertical redirect budget is exceeded. Other embodiments are disclosed and claimed.

16 Claims, 6 Drawing Sheets

APPARATUS AND METHOD FOR DEFECT REVECTORING IN A MULTI-CHANNEL MASS STORAGE DEVICE

The invention relates to mass storage devices. More particularly, some embodiments of the invention relate to an apparatus and method for defect revectoring in a multi-channel mass storage device in an electronic system such as a processor-based system.

BACKGROUND AND RELATED ART

Many electronic systems benefit from the use of mass storage devices. In some electronic systems, driver software may be provided to utilize mass storage devices. Some electronic systems may utilize a solid state drive (SSD) as a mass storage device.

BRIEF DESCRIPTION OF THE DRAWINGS

Various features of the invention will be apparent from the following description of preferred embodiments as illustrated in the accompanying drawings, in which like reference numerals generally refer to the same parts throughout the drawings. The drawings are not necessarily to scale, the emphasis instead being placed upon illustrating the principles of the invention.

DESCRIPTION

In the following description, for purposes of explanation and not limitation, specific details are set forth such as particular structures, architectures, interfaces, techniques, etc. in order to provide a thorough understanding of the various aspects of the invention. However, it will be apparent to those skilled in the art having the benefit of the present disclosure that the various aspects of the invention may be practiced in other examples that depart from these specific details. In certain instances, descriptions of well known devices, circuits, and methods are omitted so as not to obscure the description of the present invention with unnecessary detail.

Figure 1:
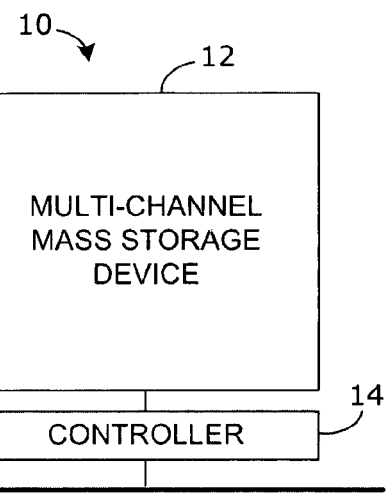
FIG. 1 is a block diagram of a mass storage system in accordance with some embodiments of the invention.

With reference to FIG. 1, a mass storage system 10 in accordance with some embodiments of the invention may include a mass storage device 12 having a plurality of memory channels, and a controller 14 coupled to the mass storage device 12. The controller 14 may be configured to control access to the mass storage device 12. For example, the controller 14 may include code to determine a first vertical redirect budget for a first memory channel of the plurality of memory channels, revector defects in the first memory channel vertically within the first memory channel until the first vertical redirect budget is exceeded, and revector defects in the first memory channel horizontally outside of the first memory channel within another memory channel of the plurality of memory channels after the first vertical redirect budget is exceeded. For example, in some embodiments of the invention the mass storage device 12 may include a solid state drive. For example, in some embodiments of the invention, the controller 14 may provide a serial advanced technology attachment (SATA) compatible interface to the solid state drive.

In some embodiments of the invention, the controller 14 may further include code to determine the first vertical redirect budget based on a number of all known defects from the plurality of memory channels. For example, the controller 14 may further include code to determine the first vertical redirect budget based on an average number of defects per memory channel. In some embodiments of the invention, the controller 14 may further include code to determine a second vertical redirect budget for a second memory channel of the plurality of memory channels, revector defects in the second memory channel vertically within the second memory channel until the second vertical redirect budget is exceeded, and revector defects in the second memory channel horizontally outside of the second memory channel within another memory channel of the plurality of memory channels after the second vertical redirect budget is exceeded. For example, the first and second vertical budgets may be the same for the first and second memory channels. For example, a single vertical budget may be determined and applied to each memory channel.

Figure 2:
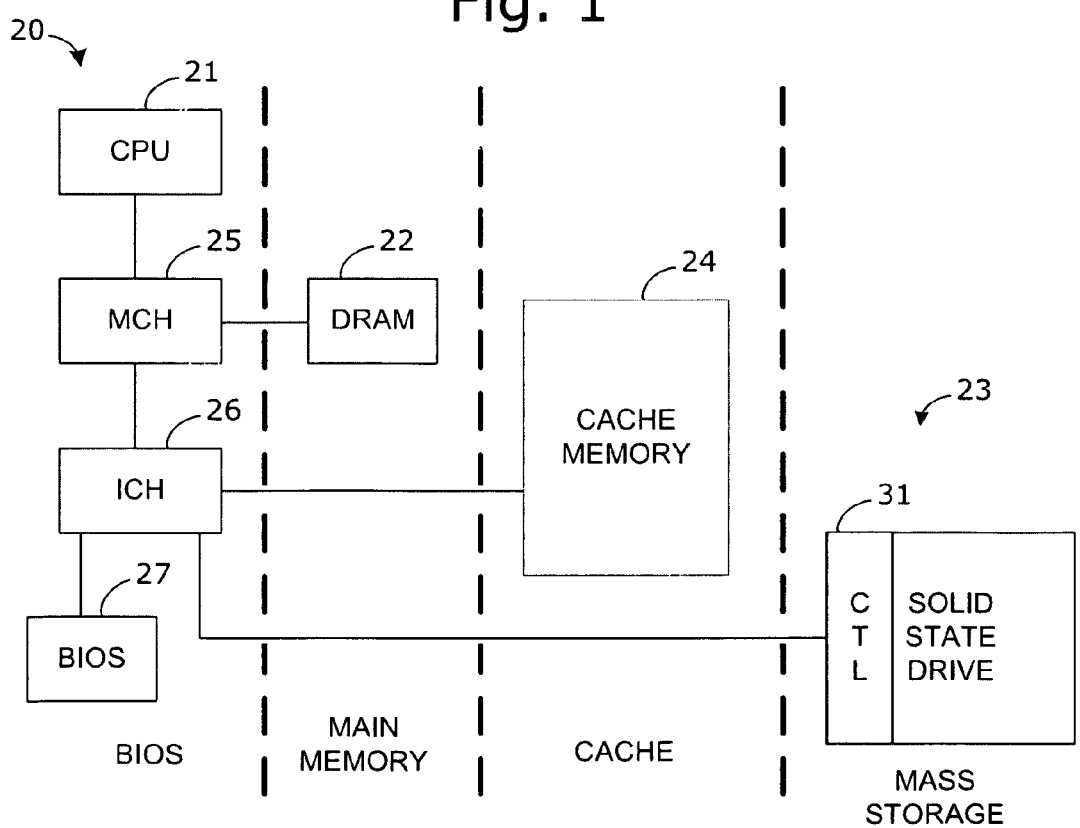
FIG. 2 is a block diagram of a processor-based system in accordance with some embodiments of the invention.

With reference to FIG. 2, a processor-based system 20 may include a processor 21, a system memory 22 coupled to the processor 21, a mass storage device 23 having a plurality of memory channels, and a cache memory 24 located between the system memory 22 and the mass storage device 23. For example, the processor 21 may be a central processing unit (CPU). For example, the system memory 22 may be a dynamic random access memory (DRAM). For example, the system memory 22 may be coupled to the processor 21 via a memory controller hub (MCH) 25. For example, the mass storage device 23 may be a multi-channel mass storage device. For example, the mass storage device 23 may be a non-rotating media such as a solid-state drive. For example, both the cache 24 and the mass storage device 23 may be coupled to the MCH 25 via an input/output controller hub (ICH) 26.

The processor-based system 20 may further include code stored on the processor-based system 20 to cause the processor-based system to utilize the mass storage device 23. For example, the code may be stored on the mass storage device 23, the system memory 22, or another memory or storage device coupled to the processor-based system 20. For example, the code may be stored as part of a basic input/output system (BIOS) 27 coupled to the ICH 26.

In some embodiments of the processor-based system 20, the code stored on the processor-based system 20 may be configured to cause the processor-based system 20 to determine a first vertical redirect budget for a first memory channel of the plurality of memory channels, revector defects in the first memory channel vertically within the first memory channel until the first vertical redirect budget is exceeded, and revector defects in the first memory channel horizontally outside of the first memory channel within another memory channel of the plurality of memory channels after the first vertical redirect budget is exceeded.

For example, in some embodiments of the processor-based system 20, the code may be further configured to cause the processor-based system 20 to determine the first vertical redirect budget based on a number of all known defects from the plurality of memory channels. For example, the code may be further configured to cause the processor-based system 20 to determine the first vertical redirect budget based on an average number of defects per memory channel. In some embodiments of the processor-based system 20, the code may be further configured to cause the processor-based system to determine a second vertical redirect budget for a second memory channel of the plurality of memory channels, revector defects in the second memory channel vertically within the second memory channel until the second vertical redirect budget is exceeded, and revector defects in the second memory channel horizontally outside of the second memory channel within another memory channel of the plurality of memory channels after the second vertical redirect budget is exceeded.

Figure 3:
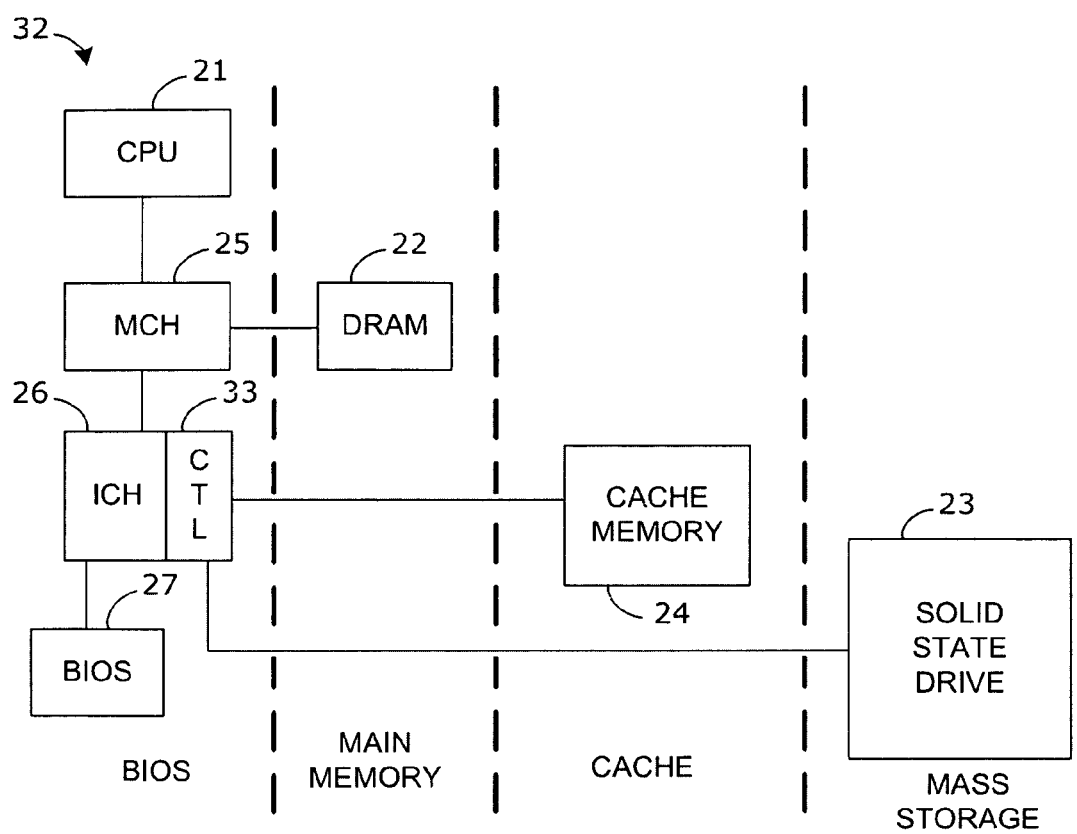
FIG. 3 is a block diagram of another processor-based system in accordance with some embodiments of the invention.

For example, in some embodiments of the processor-based system 20, all or a portion of the code may be implemented by or executed by a controller 31 which may be integrated with the mass storage device 23. Alternatively, with reference to FIG. 3, some embodiments of a processor-based system 32 may include a controller 33 located elsewhere in the processor-based system 32 and coupled to the mass storage device 23 by a bus or other electronic connection. For example, the controller 33 may be integrated with the ICH 26. In some embodiments of the processor-based system 32, the cache memory 24 may include non-volatile cache memory (NVM). For example, the controller (31 or 33) may provide a serial advanced technology attachment (SATA) compatible interface to the mass storage device 23.

Figure 4:
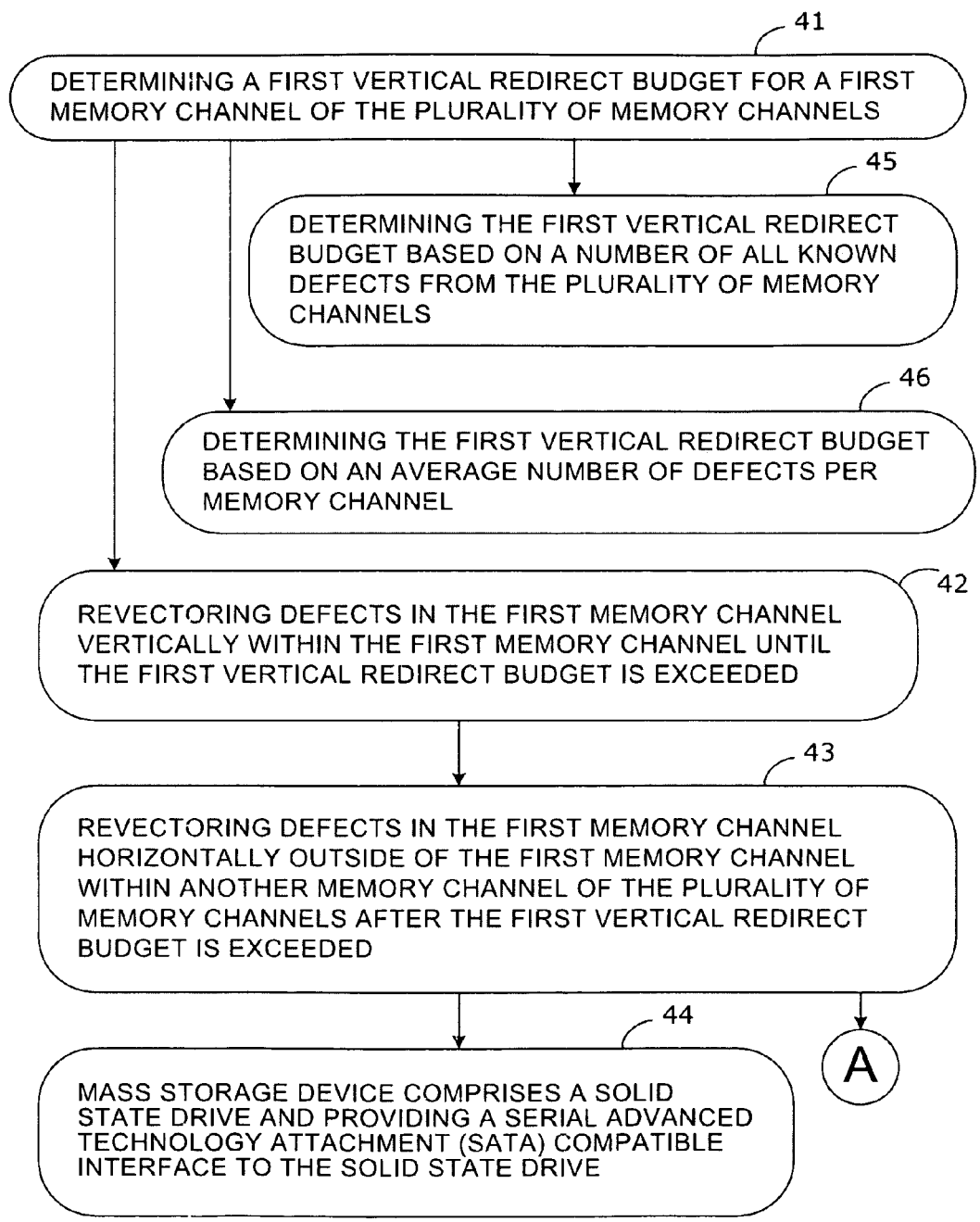
FIG. 4 is a flow diagram in accordance with some embodiments of the invention.

With reference to FIG. 4, in accordance with some embodiments of the invention a method of utilizing a mass storage device having a plurality of memory channels may include determining a first vertical redirect budget for a first memory channel of the plurality of memory channels (e.g. at block 41), revectoring defects in the first memory channel vertically within the first memory channel until the first vertical redirect budget is exceeded (e.g. at block 42), and revectoring defects in the first memory channel horizontally outside of the first memory channel within another memory channel of the plurality of memory channels after the first vertical redirect budget is exceeded (e.g. at block 43). For example, the mass storage device may include a solid state drive and some embodiments of the invention may include providing a serial advanced technology attachment (SATA) compatible interface to the solid state drive (e.g. at block 44).

In some embodiments of the invention, determining the first vertical redirect budget for the first memory channel of the plurality of memory channels may include determining the first vertical redirect budget based on a number of all known defects from the plurality of memory channels (e.g. at block 45). In some embodiments of the invention, determining the first vertical redirect budget for the first memory channel of the plurality of memory channels may include determining the first vertical redirect budget based on an average number of defects per memory channel (e.g. at block 46).

Figure 5:
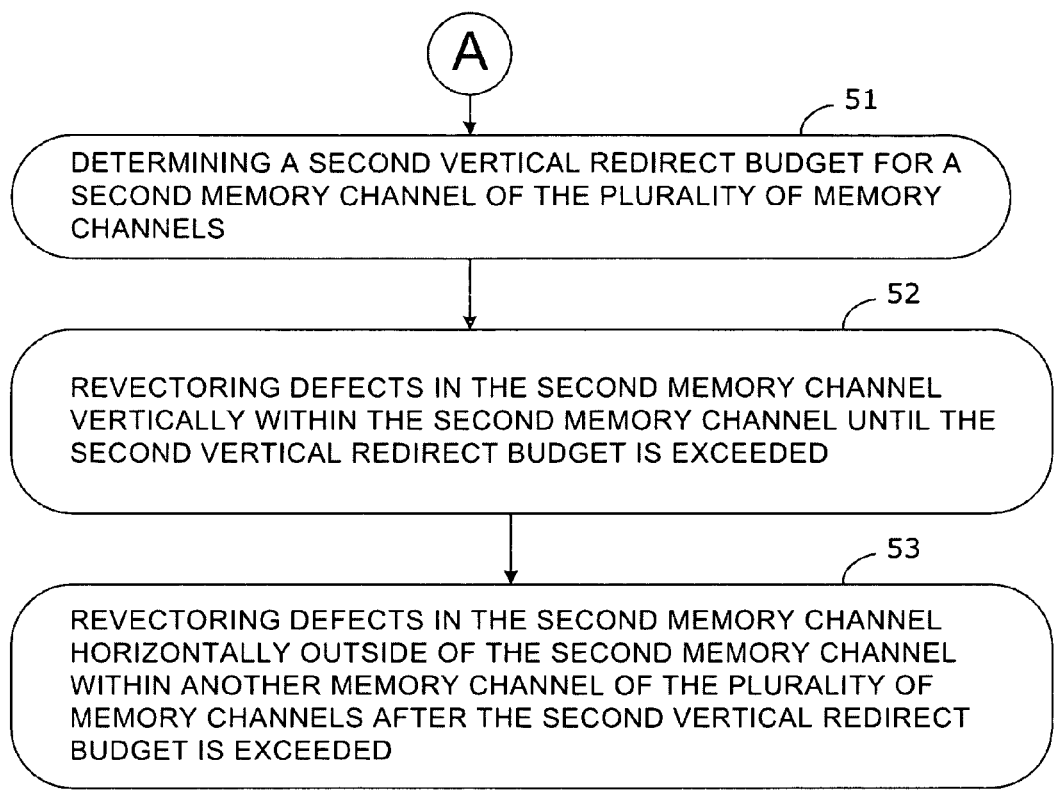
FIG. 5 is another flow diagram in accordance with some embodiments of the invention.

With reference to FIG. 5, some embodiments of the invention may further include determining a second vertical redirect budget for a second memory channel of the plurality of memory channels (e.g. at block 51), revectoring defects in the second memory channel vertically within the second memory channel until the second vertical redirect budget is exceeded (e.g. at block 52), and revectoring defects in the second memory channel horizontally outside of the second memory channel within another memory channel of the plurality of memory channels after the second vertical redirect budget is exceeded (e.g. at block 53). For example, the first and second vertical budgets may be the same for the first and second memory channels. For example, a single vertical budget may be determined and applied to each memory channel.

Advantageously, some embodiments of the invention may improve defect revectoring in a multi-channel mass storage device. For example, some embodiments of the invention may simultaneously improve two metrics, performance and capacity, in a defect management scheme for a multi-channel mass storage device. For example, all defects in need of revector may be accumulated and thereafter an average revectors per channel may be calculated. The calculated average revectors per channel may be the budget for vertical redirects for each of the channels.

For a particular channel, defects may be revectored as vertical until the number of defects for that particular channel exceeds the budget. After the number of defects for that particular channel exceeds the budget, horizontal redirects may be used for further defects in that particular channel. In practice, some embodiments of the invention may results in a relatively high usage of vertical revectors. If there is a particular memory channel (e.g. a NAND flash memory device) with a high number of defects it will increase the average such that the other memory channels get most or all of their defects as vertical. But the problematic memory channel may get relatively more horizontal revectors (e.g. mostly horizontal revectors depending on the number of defects and the number of channels). Advantageously, some implementations of a defect management policy in accordance with the invention improved sequential bandwidth in a solid state drive by about 20%.

Figure 6:
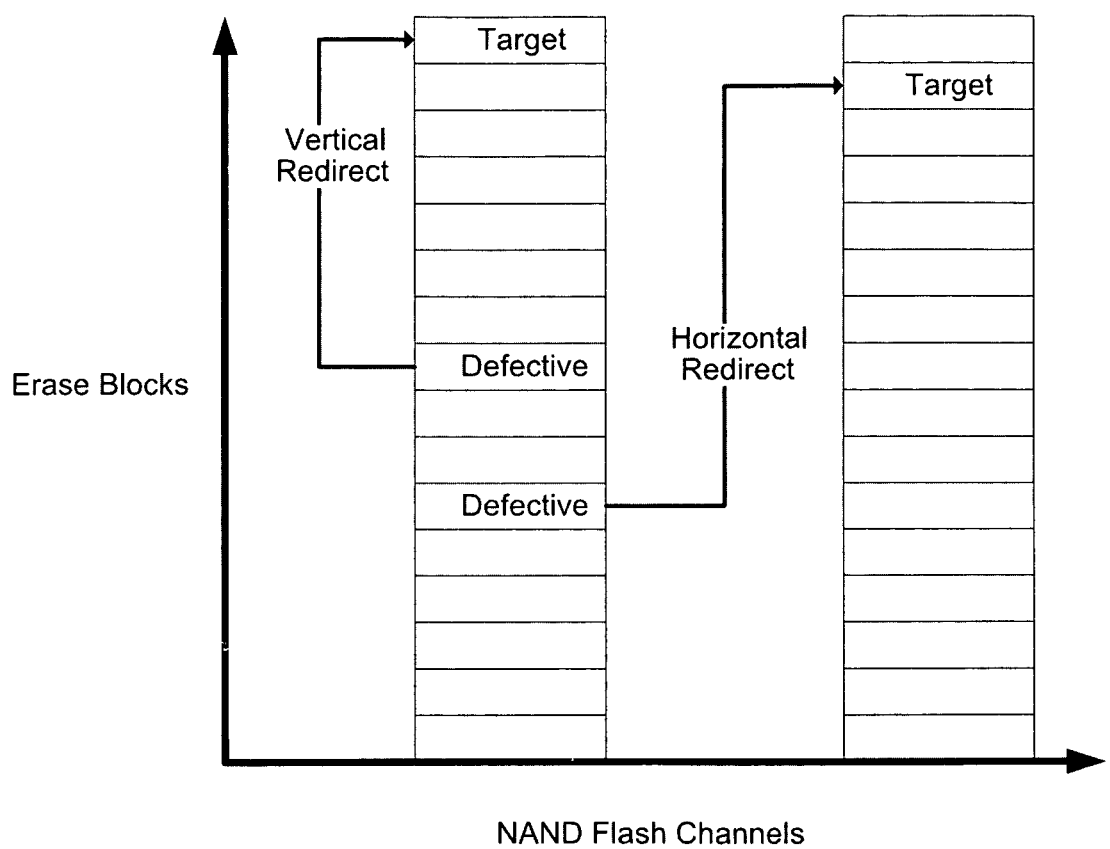
FIG. 6 is a chart in accordance with some embodiments of the invention.

With reference to FIG. 6, a chart illustrates how vertical and horizontal revectoring of defective blocks. A vertical revector of a defective block includes redirecting access to the defective block to a target block within the same memory channel in which the defective block resides. A horizontal revector of a defective block includes redirecting access to the defective block to a target block outside the memory channel in which the defective block resides.

Figure 7:
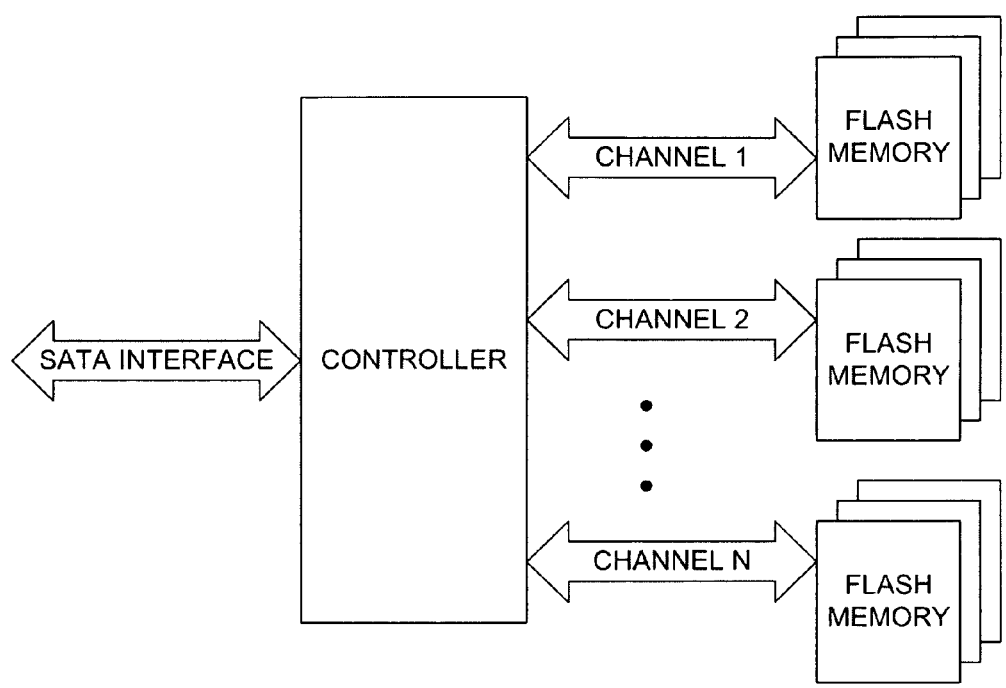
FIG. 7 is another block diagram of a mass storage system in accordance with some embodiments of the invention.

With reference to FIG. 7, some embodiments of the invention may find particular utility in a multi-channel solid state drive such as the Intel® X18-M/X25-M SATA Solid State Drive. For example, these drives may use Intel® NAND flash memory Multi-Level Cell (MLC) components. For example, the Intel X18-M/X25-M SATA SSDs may utilize a cost effective System on a Chip (SOC) design (e.g. the controller in FIG. 7) to manage a full SATA 3 Gb/s bandwidth with the host while managing multiple flash memory devices on multiple channels internally. In accordance with some embodiments of the invention, the integrated controller in the Intel SSD may implement a defect management policy wherein a vertical redirect budget is determined and wherein for each channel defects are revectored vertically until the budget is exceeded and thereafter are revectored horizontally.

Those skilled in the art will appreciate that, given the benefit of the present description, a numerous variety of other circuits and combinations of hardware and/or software may be configured to implement various methods, circuits, and systems in accordance with the embodiments described herein and other embodiments of the invention. The examples of FIGS. 1 through 7 are non-limiting examples of suitable embodiments.

The foregoing and other aspects of the invention are achieved individually and in combination. The invention should not be construed as requiring two or more of such aspects unless expressly required by a particular claim. Moreover, while the invention has been described in connection with what is presently considered to be the preferred examples, it is to be understood that the invention is not limited to the disclosed examples, but on the contrary, is intended to cover various modifications and equivalent arrangements included within the spirit and the scope of the invention.

What is claimed is:

1. A mass storage system, comprising:
a mass storage device having a plurality of memory channels;
a controller coupled to the mass storage device, wherein the controller is configured to control access to the mass storage device, and wherein the controller includes code to:
perform an evaluation of current defects from the plurality of memory channels to determine a first vertical redirect budget based on an average number of defects per memory channel;
automatically set the first vertical redirect budget using the evaluation, wherein the first vertical redirect budget is to indicate a maximum amount of vertical revectors that are allowed for a first memory channel of the plurality of memory channels;
revector defective blocks in the first memory channel vertically within the first memory channel until the automatically set first vertical redirect budget is exceeded; and
revector defective blocks in the first memory channel horizontally outside of the first memory channel within another memory channel of the plurality of memory channels after the automatically set first vertical redirect budget is exceeded, wherein defective blocks of at least one memory channel of the plurality of memory channels are revectored vertically within the at least one memory channel based on the average, and wherein defective blocks of at least one other memory channel of the plurality of memory channels are revectored horizontally outside of the at least one other memory channel based on the average.

2. The mass storage system of claim 1, wherein the mass storage device comprises a solid state drive.

3. The mass storage system of claim 2, wherein the controller provides a serial advanced technology attachment (SATA) compatible interface to the solid state drive.

4. The mass storage system of claim 1, wherein the controller further includes code to:
determine the first vertical redirect budget further based on a number of all known defects from the plurality of memory channels, wherein the automatically set first vertical redirect budget is allowed to be used in its entirety to revector defective blocks.

5. The mass storage system of claim 1, wherein the controller further includes code to:
automatically set a second vertical redirect budget using the evaluation, wherein the second vertical redirect budget is to indicate a maximum amount of vertical revectors that are allowed for a second memory channel of the plurality of memory channels;
revector defective blocks in the second memory channel vertically within the second memory channel until the automatically set second vertical redirect budget is exceeded; and
revector defective blocks in the second memory channel horizontally outside of the second memory channel within another memory channel of the plurality of memory channels after the automatically set second vertical redirect budget is exceeded.

6. A processor-based system, comprising:
a processor;
a system memory coupled to the processor;
a mass storage device having a plurality of memory channels; and
code stored on the processor-based system to cause the processor-based system to utilize the mass storage device, wherein the code is configured to cause the processor-based system to:
perform an evaluation of current defects from the plurality of memory channels to determine a first vertical redirect budget based on an average number of defects per memory channel;
automatically set the first vertical redirect budget using the evaluation, wherein the first vertical redirect budget is to indicate a maximum amount of vertical revectors that are allowed for a first memory channel of the plurality of memory channels;
revector defective blocks in the first memory channel vertically within the first memory channel until the automatically set first vertical redirect budget is exceeded; and
revector defective blocks in the first memory channel horizontally outside of the first memory channel within another memory channel of the plurality of memory channels after the automatically set first vertical redirect budget is exceeded, wherein defective blocks of at least one memory channel of the plurality of memory channels are revectored vertically within the at least one memory channel based on the average, and wherein defective blocks of at least one other memory channel of the plurality of memory channels are revectored horizontally outside of the at least one other memory channel based on the average.

7. The processor-based system of claim 6, wherein the mass storage device comprises a solid state drive.

8. The processor-based system of claim 7, further comprising:
a controller to provide a serial advanced technology attachment (SATA) compatible interface to the solid state drive.

9. The processor-based system of claim 6, wherein the code is further configured to cause the processor-based system to:
determine the first vertical redirect budget further based on a number of all known defects from the plurality of memory channels, wherein the automatically set first vertical redirect budget is allowed to be used in its entirety to revector defective blocks.

10. The processor-based system of claim 6, wherein the code is further configured to cause the processor-based system to:
automatically set a second vertical redirect budget using the evaluation, wherein the second vertical redirect budget is to indicate a maximum amount of vertical revectors that are allowed for a second memory channel of the plurality of memory channels;
revector defective blocks in the second memory channel vertically within the second memory channel until the automatically set second vertical redirect budget is exceeded; and
revector defective blocks in the second memory channel horizontally outside of the second memory channel within another memory channel of the plurality of memory channels after the automatically set second vertical redirect budget is exceeded.

11. A method of utilizing a mass storage device having a plurality of memory channels, comprising:
- performing an evaluation of current defects from the plurality of memory channels to determine a first vertical redirect budget based on an average number of defects per memory channel;
- automatically setting the first vertical redirect budget using the evaluation, wherein the first vertical redirect budget indicates a maximum amount of vertical revectors that are allowed for a first memory channel of the plurality of memory channels;
- revectoring defective blocks in the first memory channel vertically within the first memory channel until the automatically set first vertical redirect budget is exceeded; and
- revectoring defective blocks in the first memory channel horizontally outside of the first memory channel within another memory channel of the plurality of memory channels after the automatically set first vertical redirect budget is exceeded, wherein defective blocks of at least one memory channel of the plurality of memory channels are revectored vertically within the at least one memory channel based on the average, and wherein defective blocks of at least one other memory channel of the plurality of memory channels are revectored horizontally outside of the at least one other memory channel based on the average.

12. The method of claim 11, wherein the mass storage device comprises a solid state drive.

13. The method of claim 12, further comprising:
- providing a serial advanced technology attachment (SATA) compatible interface to the solid state drive.

14. The method of claim 11, wherein determining the first vertical redirect budget for the first memory channel of the plurality of memory channels comprises:
- determining the first vertical redirect budget further based on a number of all known defects from the plurality of memory channels, wherein the automatically set first vertical redirect budget is allowed to be used in its entirety to revector defective blocks.

15. The method of claim 11, further comprising:
- automatically setting a second vertical redirect budget using the evaluation, wherein the second vertical redirect budget indicates a maximum amount of vertical revectors that are allowed for a second memory channel of the plurality of memory channels;
- revectoring defective blocks in the second memory channel vertically within the second memory channel until the automatically set second vertical redirect budget is exceeded; and
- revectoring defective blocks in the second memory channel horizontally outside of the second memory channel within another memory channel of the plurality of memory channels after the automatically set second vertical redirect budget is exceeded.

16. The mass storage system of claim 1, wherein the revector of defective blocks in the first memory channel vertically is to include redirecting access to a defective block to a target block within the same memory channel in which the defective block resides, and the revector of defective blocks in the first memory channel horizontally is to include redirecting access to a defective block to a target block outside the memory channel in which the defective block resides.

* * * * *